(12) United States Patent
Goodno

(10) Patent No.: US 12,046,865 B2
(45) Date of Patent: Jul. 23, 2024

(54) SERVO-STABILIZED PHASE DEMODULATED FIBER AMPLIFIER SYSTEM

(71) Applicant: NORTHROP GRUMMAN SYSTEMS CORPORATION, Falls Church, VA (US)

(72) Inventor: Gregory Goodno, Los Angeles, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 754 days.

(21) Appl. No.: 17/171,009

(22) Filed: Feb. 9, 2021

(65) Prior Publication Data

US 2022/0255281 A1   Aug. 11, 2022

(51) Int. Cl.
*H01S 3/067*   (2006.01)
*H01S 3/094*   (2006.01)
*H01S 3/23*    (2006.01)

(52) U.S. Cl.
CPC ........ *H01S 3/06754* (2013.01); *H01S 3/0675* (2013.01); *H01S 3/094003* (2013.01); *H01S 3/2308* (2013.01)

(58) Field of Classification Search
None
See application file for complete search history.

(56) References Cited

U.S. PATENT DOCUMENTS 9,036,252 B1    5/2015  Goodno et al.
10,811,837 B2 * 10/2020 Goodno ............. H01S 3/10084
2019/0179015 A1 6/2019  Raring et al.
2019/0305505 A1 10/2019 Goodno et al.
2020/0227883 A1 7/2020  Goodno et al.
2021/0021095 A1 1/2021  Di Teodoro et al.

OTHER PUBLICATIONS

Fathi et al. "Towards Ultimate High-Power Scaling: Coherent Beam Combining of Fiber Lasers", Photonics 2021, 8, 566. https://doi.org/10.3390/photonics8120566 (Year: 2021).*
Gregory D. Goodno and Joshua E. Rothenberg, Suppression of stimulated Brillouin scattering in high power fibers using nonlinear phase demodulation, Optics Express, Apr. 29, 2019, pp. 13129-13141, vol. 27, No. 9.

* cited by examiner

*Primary Examiner* — Eric L Bolda
(74) *Attorney, Agent, or Firm* — John A. Miller; Shumaker, Loop & Kendrick LLP

(57) ABSTRACT

A fiber laser amplifier system including a non-linear fiber amplifier receiving a seed beam and a pump beam, where the amplifier amplifies the seed beam using the pump beam to provide an output beam having a carrier spectrum. A beam sampler samples off a sample beam from the output beam, a filter receives the sample beam and filters out the carrier spectrum from the sample beam, a photodetector detects beam power of the filtered sample beam and provides a beam power signal, and a controller receives the beam power signal, where the controller controls one or more of an FM drive signal, an AM drive signal and a pump beam to change seed beam FM modulation, seed beam AM modulation and/or pump power in a manner that reduces the beam power of the filtered sample beam and thus beam power outside of the carrier spectrum.

19 Claims, 5 Drawing Sheets

SERVO-STABILIZED PHASE DEMODULATED FIBER AMPLIFIER SYSTEM

BACKGROUND

Field

This disclosure relates generally to a phase-demodulated fiber laser amplifier system that employs demodulation drift control and, more particularly, to a phase-demodulation fiber laser amplifier system that employs demodulation drift control by dithering one or more of frequency modulation of a seed beam, amplitude modulation of the seed beam or beam power and detecting changes in sideband power of an output beam so as to reduce the sideband power and provide a greater amount of beam power in a demodulated carrier band of the output beam.

Discussion

High power laser amplifiers have many applications, including industrial, commercial, military, etc. One specific example of an application for a high power laser amplifier is a laser weapons system. Designers of laser amplifiers are continuously investigating ways to increase the power of the laser amplifier for these and other applications. One known type of laser amplifier is a fiber laser amplifier that employs a doped fiber that receives a seed beam and a pump beam to amplify the seed beam and generate the laser output beam, where the fiber typically has an active core diameter of about 10-20 µm.

Improvements in fiber laser amplifier designs have increased the output power of the fiber amplifier to approach its practical power and beam quality limit. To further increase the output power some fiber laser amplifier systems employ multiple fiber laser amplifiers that combine the amplified beams in some fashion to generate higher powers. A design challenge for fiber laser amplifier systems of this type is to combine the beams from a plurality of fiber amplifiers in a manner so that the beams provide a single beam output having a uniform phase over the beam diameter such that the beam can be focused to a small focal spot. Focusing the combined beam to a small spot at a long distance (far-field) defines the quality of the beam.

In one multiple fiber laser amplifier system design known as spectral beam combining (SBC), a plurality of master oscillators (MOs) generate a plurality of fiber seed beams at different wavelengths, where each fiber seed beam is amplified. The amplified fiber seed beams are then directed to a diffraction grating, or other wavelength-selective element, that combines the different wavelength fiber beams into a single output beam. The diffraction grating has a periodic structure formed into the element so that when the individual fiber beams each having a slightly different wavelength and angular direction are redirected by the periodic structure all of the beams diffract from the diffraction grating in the same direction.

SBC is a one method for scaling laser sources to weapons-class brightness, for example, greater than the 100 kW level with near diffraction limited beam quality. As mentioned, SBC laser weapons systems typically employ a dispersive optic, such as a diffraction grating, that combines beams from multiple high power laser channels, such as Yb-doped fiber amplifiers (YFDAs), although any suitable laser element can be used. Because of the limited gain bandwidth of the lasing gain medium (e.g. ~40 nm accessible gain bandwidth for YDFAs), the laser beam source channels must be configured to provide high spectral brightness (kW/nm) in order to scale an SBC system to high power while maintaining good combined beam quality, which due to angular dispersion from the grating will be degraded if the channel linewidths are not relatively narrow.

In order to achieve high spectral brightness from a YDFA, it is necessary to seed the amplifier with low power, narrow linewidth light. However, two nonlinear impairments in the YDFA constrain the seed beam characteristics. First, stimulated Brillouin scattering (SBS) requires that the seed beam linewidth be broadened to decrease its coherence length, and thus increase the SBS power threshold. Second, the Kerr nonlinearity imposes a requirement that the seed beam exhibit low relative intensity noise (RIN) to prevent unwanted nonlinear spectral broadening via self-phase modulation (SPM) or cross-phase modulation (XPM) in the YDFA.

These two nonlinear impairments typically require an SBC system architecture having a plurality of channels, where each laser channel includes a low power master oscillator front end assembly (MOFEA) and a high power YDFA (or chain of YDFAs), whose output beams are combined using beam combining optics into a single beam. Each MOFEA includes a master oscillator (MO) that typically is a single-longitudinal mode distributed feedback (DFB) diode laser oscillator that is followed by an electro-optic modulator (EOM). The EOM changes the phase of the seed beam proportionally to an applied voltage. By applying a radio frequency (RF) source with high power to the EOM, the output beam will have its linewidth substantially broadened compared to the input seed beam. Typical values for linewidth broadening suitable to seed kW-class YDFAs without SBS impairments are on the order of ~10 GHz per kW of amplified output power. The linewidth-broadened seed beam will ideally exhibit zero RIN, since only its phase is modulated and not its amplitude. This prevents unwanted spectral broadening, and consequent loss of beam quality of the combined SBC beam, by avoiding SPM or XPM in the YDFA.

For air and land platforms in particular, the size, weight and power (SWaP) of the fiber laser system is a major factor limiting deployment and use. In particular, the MOFEA suffers from a high part count and consequent high cost. While there is certainly opportunity for more compact packaging and routing of components, the requirement for parallel high power RF sources and EOMs for the multiple channels is a significant contributor to both SWaP and the cost of the MOFEA. There is a need for architectural and component improvements that would enable a reduction in the SWaP and cost of MOFEAs used for SBC laser beam sources.

U.S. Pat. No. 9,036,252 titled, Nonlinear Spectrally Narrowed Fiber Amplifier, issued May 19, 2015 to Goodno et al., assigned to the assignee of this application and herein incorporated by reference, discloses a fiber laser amplifier system that provides high power and narrow linewidth for improved spectral brightness. The fiber amplifier system disclosed in the '252 patent includes a single frequency master oscillator laser that is spectrally broadened using an auxiliary electro-optic phase modulator to provide an optical seed beam that exhibits a narrow optical spectrum whose width is defined as the "carrier" spectral band. A harmonic phase modulator receives the seed beam and an RF drive signal so as to frequency modulate the seed beam using the drive signal to remove optical power from the main carrier band or zeroth-order frequency of the seed beam and put the power into sideband frequencies separated by the frequency of the drive signal. A dispersion element receives the frequency modulated seed beam and provides temporal amplitude modulation of the seed beam. A non-linear fiber amplifier receives the frequency and amplitude modulated seed beam from the dispersion element and amplifies the seed beam, where the frequency modulation and self-phase modulation (SPM) caused by the non-linearity of the fiber amplifier combine to remove the optical power from the sideband frequencies and put it back into the zeroth-order carrier frequency band.

The essential physics of this approach can be described by the equation:

$$FM = -B \cdot AM = -SPM, \quad (1)$$

where FM is peak-to-peak (p2p) phase shift imposed on the seed beam, AM is p2p power variation relative to the continuous wave power imposed on the seed beam, B is the fiber "B-integral", which is the nonlinear phase shift due to the Kerr effect, and SPM is p2p phase due to self-phase modulation. The B-integral increases linearly as the fiber power or length increases.

When the AM and FM values are tuned to satisfy equation (1) at a given fiber power level, or value of B, then the accumulated SPM at the output will be equal and opposite to the FM applied at the input, and the two modulations cancel each other out. Hence, the output spectrum will be nearly identical to the input carrier spectrum of the optical seed beam prior to application of the FM. Because the AM plus FM spectrum remains broadened over much of the fiber length, the SBS gain is decreased relative to traditional architectures that use an optical seed beam only. As the fiber B-integral, i.e., the fiber power or length, increases, larger values of FM can be applied to broaden the seed beam spectrum further, and the attainable SBS suppression also increases. Therefore this concept is of high interest for high power, narrow linewidth fiber amplifiers, especially when a long passive delivery fiber is required for system integration.

As generally discussed above, the '252 patent fiber laser amplifier system frequency modulates the seed beam and then uses dispersion to amplitude modulate the frequency modulated seed beam, where the amplitude modulation drives the self-phase modulation caused by the non-linearity of the fiber amplifier to cause the spectrum of the beam as it is being amplified to be reduced to create the high power output beam having a narrow linewidth. Although this technique can effectively provide a high power and narrow linewidth beam as described, relying on dispersion to provide amplitude modulation of the seed beam is limited because the amplitude modulation is not precisely matched to the frequency modulation, which limits the efficiency of non-linear spectral compression in the fiber amplifier at higher modulation depths. More particularly, for low modulation depths and high non-linear fiber amplifiers the spectral compression in the fiber amplifier is effective. However, for lower amounts of non-linearity in the fiber amplifier, more dispersion is required to obtain deeper amplitude modulation of the beam. But, for larger amounts of dispersion the shape in time of the amplitude modulation does not precisely match the shape in time of the frequency modulation linewidth broadening, i.e., the amplitude modulation waveform is not perfectly sinusoidal, and thus the non-linear spectral compression will be inefficient and significant power will remain in the sidebands, which limits the amount the linewidth can be reduced. Therefore, there is a tradeoff between the spectral compression efficiency and higher SBS suppression.

U.S. Pat. No. 10,811,837 titled, AM/FM Seed For Nonlinear Spectrally Compressed Fiber Amplifier, issued Oct. 20, 2020 to Goodno, assigned to the assignee of this application and herein incorporated by reference, discloses a fiber laser amplifier system that operates in a similar manner as the '252 laser amplifier system, but is an improvement thereon. The '837 laser amplifier system includes an optical source providing an optical seed beam and an FM EOM that frequency modulates the seed beam to broaden its spectral linewidth. The system also includes an AM EOM that modulates the seed beam to provide an amplitude modulated seed beam that is synchronized with the frequency modulated seed beam. The system also includes a non-linear fiber amplifier receiving the AM and FM seed beam, where the amplitude modulated seed beam causes self-phase modulation in the fiber amplifier that phase modulates the seed beam as it is being amplified by the fiber amplifier that acts to cancel the spectral linewidth broadening caused by the frequency modulation.

Although this technique can effectively provide a high power and narrow linewidth beam as described, one issue is that some fraction of YDFA output power remains in spectral sidebands. Some of this sideband power is unavoidable due to the residual AM that remains on the output power, but for typical AM parameters with less than 70% p2p modulation this is about 2% or less. However, when the AM, FM and B (fiber output power) aren't adequately matched to satisfy equation (1), then the fraction of power in the sidebands can increase beyond the AM limited value. In an SBC system, this sideband power is effectively lost from the combined beam since it will diffract into far field sidelobes, which is effectively lost power for an SBC system.

In practice, the performance of the fiber laser amplifier system disclosed in the '837 patent can be optimized by tuning the AM and FM parameters to match the effective B-integral for each fiber channel. For a real system, it is possible that any or all of the AM modulation depth, the FM modulation depth and/or the amplifier power, which is proportional to the B-integral, may drift over time as a result of various factors such as component age and temperature changes, which will reduce the spectral compression efficiency due to the failure to precisely satisfy equation (1).

The tolerance in the YDFA power and RF seeder parameters, i.e., the AM and FM modulation depths, required to achieve high compression efficiency become tighter for higher values of FM needed to achieve the highest SBS suppression levels. For scaling to MW-class SBC high energy lasers (HELs) it is expected that FM values ~20 rad may be implemented. If 1% HEL sideband power loss is allocated toward mismatched parameters, then the amplifier power, AM modulation depth and FM modulation depth would need to be stabilized to within ~0.5%. However, this is not consistent with long-term stability of fiber amplifiers and modulation components used in fieldable systems. Hence, there is a need for active servo stabilization of the system parameters to maintain spectral sideband power losses below 1%.

SUMMARY

This disclosure discusses and describes a fiber laser amplifier system including at least one master oscillator providing an optical seed beam at a certain wavelength and at least one phase modulation electro-optic modulator (EOM) responsive to the seed beam and a first RF drive signal, where the phase modulation EOM phase modulates the seed beam using the first RF drive signal so as to broaden its spectral linewidth to span a carrier spectral band. The system further includes a frequency modulation (FM) EOM responsive to the seed beam and a second RF drive signal, where the FM EOM frequency modulates the seed beam using the second drive signal so as to further broaden its spectral linewidth. The system also includes an amplitude modulation (AM) EOM responsive to the FM seed beam and a third RF drive signal, where the AM EOM amplitude modulates the FM seed beam using the third drive signal so as to provide an AM and FM seed beam, where the amplitude and frequency modulations are synchronized. The system further includes a non-linear fiber amplifier receiving the AM and FM seed beam and a pump power beam, where the amplifier amplifies the seed beam using the pump beam to provide an output beam where most of the beam power resides within the carrier spectral band. A beam sampler samples off a sample beam from the output beam, a filter receives the sample beam and filters out the carrier spectrum from the sample beam, a photodetector detects beam power of the filtered sample beam and provides a beam power signal, and a controller receives the beam power signal, where the controller controls one or more of the second drive signal, the third drive signal and the pump power beam to change the FM modulation depth, AM modulation depth and/or pump power in a manner that reduces the beam power of the filtered sample beam and thus beam power outside of the carrier spectrum.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a fiber laser amplifier system that employs sideband power drift control is merely exemplary in nature, and is in no way intended to limit the disclosure or its applications or uses.

Figure 1:
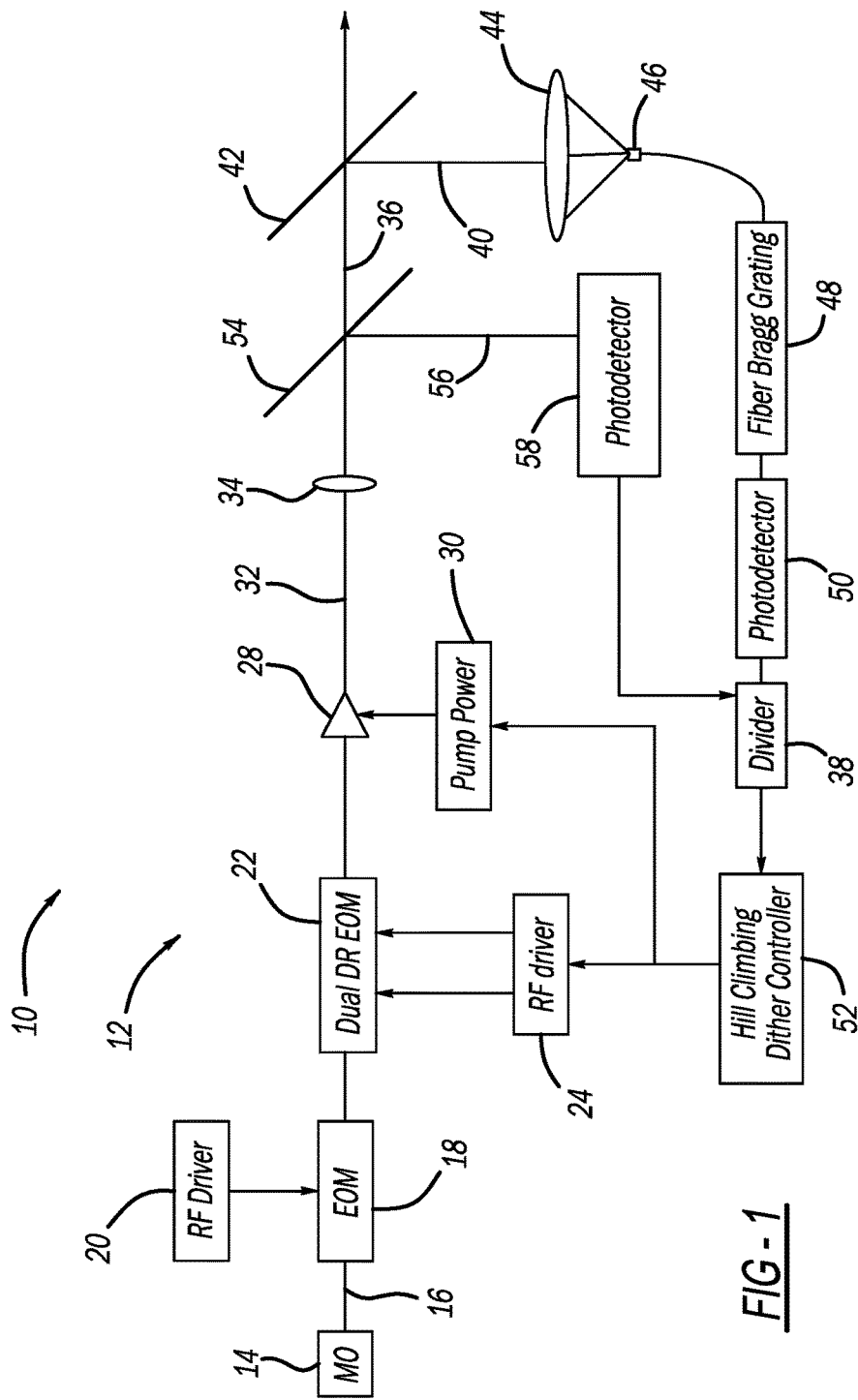
FIG. 1 is a schematic block diagram of a single channel fiber laser amplifier system including a servo control architecture.

FIG. 1 is a schematic block diagram of a fiber laser amplifier system 10 that includes a single amplification channel 12 having a master oscillator (MO) 14 that generates a continuous wave single frequency seed beam on a fiber 16 having wavelength λ, where the MO 14 can be, for example, a single-longitudinal mode distributed feedback (DFB) diode laser oscillator. The seed beam is provided to a phase modulation electro-optical modulator (EOM) 18 that changes the phase of the seed beam to be proportional to an applied voltage provided by an amplified radio frequency (RF) electrical driver 20 with high power, such as white noise or pseudo-random bit sequence (PRBS), so that the output seed beam has a linewidth that is substantially broadened compared to the input seed beam, where the broadened linewidth of the seed beam suppresses stimulated Brillouin scattering in a non-linear fiber amplifier 28 discussed below. The spectral width of the seed beam following the EOM 18 is defined as the carrier band. The E-field $E_1(t)$ of the seed beam following the EOM 18 will be of the form:

$$E_1(t) = \exp[i\phi(t)]. \quad (2)$$

As can be seen from equation (2), the seed beam E-field amplitude is constant in time and its phase is time-varying with the function $\phi(t)$ imposed by the EOM 18.

The modulated seed beam from the EOM 18 is then sent to a dual drive EOM 22 that provides both frequency modulation and amplitude modulation of the seed beam in the manner described in the '837 patent, where the EOM 22 can be separated into two EOMs, with one providing amplitude modulation and the other providing frequency modulation as discussed in the '837 patent. The EOM 22 receives a pair of RF drive signals, each of which are proportional to a time-dependent signal f(t), from an RF driver 24 where one signal is used for the frequency modulation and the other signal is used for the amplitude modulation, where the signals are synchronized with each other. The EOM 22 imposes one of the RF drive signals onto the phase of the optical seed beam to vary the frequency of the seed beam in time and provide the frequency modulation, where the frequency modulated field is of the form:

$$E_2(t) = E_1(t) e^{i\beta f(t)}, \quad (3)$$

and where the drive signal f(t) is assumed to be zero-mean (time-averaged), and normalized to unity, and β is a frequency modulation depth in radians. Hence, the FM waveform in equation (1) is FM(t)=βf(t).

The frequency modulation provides a time dependent change in the phase of the seed beam that broadens the beam's linewidth, where the broad linewidth provides SBS suppression. In one non-limiting example for discussion purposes herein, the RF drive signal provided by the driver 24 is a single-tone sinusoidal signal $f(t)=\sin(\omega_m t)$, where $\omega_m/2\pi$ is a modulation frequency that could be 32 GHz, which is twice the Stokes frequency shift caused by SBS in a fused silica fiber. However, it is noted that other high frequency sinusoidal drive signals can also be employed in various applications. More generally, the drive signal f(t) need not be sinusoidal and can be of any functional form, including for example, a PRBS format, or a shaped noise spectrum.

The frequency modulation provided by the EOM 22 generates an optical seed beam that includes broadened spectral linewidth that is defined by the functional form f(t) and modulation depth β of the drive signal. In the non-limiting example described herein, the spectral content of the seed beam will include frequency sidebands separated by 32 GHz. The modulation depth β of the RF drive signal from the driver 24 is selected depending on the desired spectral linewidth, where a higher modulation depth signal would generate a broader linewidth. For example, in the non-limiting described example herein, the modulation depth β of the drive signal may be selected to remove all of the power from the zeroth-order frequency, i.e., the carrier band, of the seed beam in the EOM 22. Alternately, the modulation depth β of the drive signal may be selected to create equal amplitude powers in the zeroth and +/− first order sideband frequencies of the seed beam in the EOM 22. Alternately, the modulation depth β of the drive signal may be selected to create a large number of sidebands of the seed beam in the EOM 22.

The other RF drive signal from the RF driver 24 provides amplitude modulation of the seed beam, i.e., varies the power of the seed beam in time, where the EOM 22 imposes the drive signal onto the amplitude of the optical seed beam to provide the amplitude modulation. The RF drive signals are synchronized via the common underlying drive signal f(t) so as to produce an AM/FM field output from the EOM 22 of the form:

$$E_3(t) = \sqrt{1 - \frac{\beta}{B}f(t)} \; E_2(t) = \sqrt{1 - \frac{\beta}{B}f(t)} \, e^{i\beta f(t)} E_1(t), \tag{4}$$

where the parameter B is a non-linear phase shift (in radians) due to self-phase modulation that is associated with the fiber amplifier 28 that will be seeded by the AM/FM source, i.e., the amplified high power beam emitted from the fiber amplifier will experience a nonlinear phase shift of parameter B. Hence, the AM waveform in equation (1) is $$AM(t) = -\frac{\beta}{B}f(t).$$

Without the frequency modulation, the amplitude modulation $$\sqrt{1 - \frac{\beta}{B}f(t)}$$

of the seed beam would provide very little broadening of the seed beam linewidth. As is apparent from inspection of equation (4), the amplitude modulation is synchronized with the frequency modulation so that peaks of the amplitude align with valleys of the phase.

The amplitude and frequency modulated seed beam is then sent to the non-linear fiber amplifier 28, which may be a plurality of fiber amplification stages each including a pump beam from a pump beam source 30 and a length of doped fiber, such as a ytterbium (Yb) doped length of fiber having a 10-20 μm core, and the amplified output beam is provided on fiber 32. The amplitude modulation and the frequency modulation are synchronized per equation (4) so that for a given non-linearity parameter B of the fiber amplifier 28 an optimal spectral compression of the amplified beam can be provided for high power and narrow linewidth. The combined amplitude modulated and frequency modulated seed beam is tailored to the non-linearity of the fiber amplifier 28 so that the spectral linewidth is broad when the seed beam is sent to the amplifier 28. Because of the non-linear Kerr effect in the fiber amplifier 28, where the power-dependent refractive index of the fiber causes greater phase shifts in the optical beam at higher power, the interaction of the amplitude modulated power variations in the seed beam creates synchronous phase shifts of the beam in the fiber amplifier 28. The time-dependent non-linear phase that arises due to this self phase modulation is:

$$SPM(t) = B|E_3(t)|^2 = B\left[1 - \frac{\beta}{B}f(t)\right] = B - \beta f(t). \tag{5}$$

Consequently, the amplified E-field emitted from the fiber amplifier 28 is:

$$E_4(t) = \tag{6}$$

$$E_3(t)e^{iSPM(t)} = \sqrt{1 - \frac{\beta}{B}f(t)} \, e^{i\beta f(t)} e^{i[B-\beta f(t)]} E_1(t) = \sqrt{1 - \frac{\beta}{B}f(t)} \, e^{iB} E_1(t).$$

Equation (6) shows that the phase shift SPM(t) that occurs due to the non-linear self-phase modulation cancels the frequency modulation βf(t) that was previously provided from the EOM 22. The only remaining phase term is a constant global phase shift B that does not affect the optical spectrum. As the seed beam propagates through the fiber amplifier 28 and is amplified, the non-linear Kerr effect causes self-phase modulation in the amplifier 28 that causes power of the beam to shift back to the original carrier band associated with the field $E_1(t)$ so as to provide a high power beam with a narrow linewidth at the fiber amplifier output.

By cancelling the frequency modulation in the optical signal through this effect, the carrier spectrum of the original beam $E_1(t)$ can be nearly perfectly recovered at the output of the amplifier 28, with only a small amount of linewidth broadening arising from the residual amplitude modulation term $$\sqrt{1 - \frac{\beta}{B}f(t)}.$$

The change in the spectrum between the input and output of the amplifier 28 (E-fields $E_3(t)$ and $E_4(t)$, respectively) reduces the spectral overlap of backscattered SBS from different locations in the length of the fiber amplifier 28. This increases the SBS threshold in comparison to a seed spectrum without modulation. In other words, as a result of there being broader spectral linewidth of the seed beam represented by E-field $E_3(t)$ when the seed beam is frequency modulated there is reduced back-scattering of light that is spectrally overlapped with the linewidth of the amplified beam represented by E-field $E_4(t)$. As the optical power is spectrally compressed by accumulated self-phase modulation as the beam propagates through the fiber amplifier 28, the SBS increases, but it is limited by the reduction of the spectral brightness earlier in the beam propagation. The amplified beam on the fiber 32 is emitted into free space by emitter optics 34 as a high power output beam 36.

As discussed above, the components in the system 10 discussed thus far are subject to drift and thus the power in the main carrier spectral band of the output beam 36 is reduced over time and over different operating conditions. This disclosure proposes providing a slow servo control to correct for such drift so that the beam power is maintained in the main carrier spectrum, i.e, power within the desired output carrier spectral band centered at about 0 frequency shift of the output beam 36. As will be discussed below, a small dither signal is placed on one or more of the parameters AM, FM or B-integral and the change in the beam power outside of the carrier spectrum is observed to minimize the error by correcting any one or more of the parameters AM, FM or B-integral so that equation (1) is satisfied, where the parameter that the dither signal is placed on does not have to be the parameter that is adjusted.

In order to provide such control, a low power sample beam 40 is sampled off of the output beam 36 by a beamsplitter 42 and is focussed by a lens 44 onto a coupler 46 that couples the focussed sample beam into a fiber Bragg grating (FBG) 48. The FBG 48 is configured as a blocking filter for the carrier band to block light in the carrier spectrum and pass light in the spectral sidebands of the sample beam 40 that resides outside the carrier spectrum, which is detected by a photodetector 50 and converted to an electrical signal. The electrical signal is provided to a hill climbing dither controller 52 that applies a small zero-mean dither to any one of the parameters AM, FM or B-integral defined by equation (1). The gain of the RF drive signal from the driver 24 can be modulated to apply a dither to the AM or FM modulation depths, or the pump power from the source 30 to the fiber amplifier 28 can be modulated to apply a dither to the B-integral. The dithered parameter will cause a synchronous change in the uncompressed spectral sideband power of the output beam 36 that will cause a corresponding change in the detected photocurrent in the photodetector 50. Based on the change in the detected photocurrent, the setpoints of any one of the parameters AM, FM or B-integral are adjusted to minimize the photocurrent. This corresponds to the condition of maximum spectral compression efficiency of power back into the carrier spectrum, i.e., satisfying the condition of equation (1).

It is noted that if the pump power (B-integral) is modulated to reduce the power in the sidebands as described, this will also modulate the total amplified signal power integrated over all of the spectral bands. Therefore, this signal power modulation must be removed from the detected out-of-band power signal from the photodetector 50. This power modulation removal can be performed by a normalization measurement of the total amplifier power synchronously with the out-of-band power. Typically, fiber amplifiers have built-in total signal power monitors that can be used for this purpose, or an additional low power beam sample may be generated and detected to generate a photocurrent signal that is proportional to the total amplifier power. Another beam splitter 54 can be employed to provide another sample beam 56 of the total beam power, which is detected by a photodetector 58 that generates an output that is proportional to the total beam power. The output of the photodetector 50 is divided in a divider 38 by the output of the photodetector 58 to provide a normalized out-of-band power signal that is sent to the controller 52. Alternatively, normalization can be performed by simply noting the diode current modulation depth of the pump beam diodes in the pump beam source 30. Since diode pump power is roughly proportional to the diode drive current, and since laser output power is linearly proportional to the diode pump power, the amplified laser power modulation depth can be inferred directly from knowledge of the diode current modulation depth. For example, if the diode driver current drops by 1%, then the total laser output power will drop by 1%. If the measured out-of-band power drops by more than 1% then this means the pump power setpoint should be decreased. If the measured out-of-band power drops by less than 1%, or even increases as the diode power is dropped, then the pump power setpoint should be increased. Overall, the impact of the pump power modulation, even if un-normalized, will be simply to shift the locking setpoint away from its optimal position by approximately the modulation depth of the pump power dither, which is expected to be at the 1% level and therefore within 1% of the optimum value.

Figure 2:
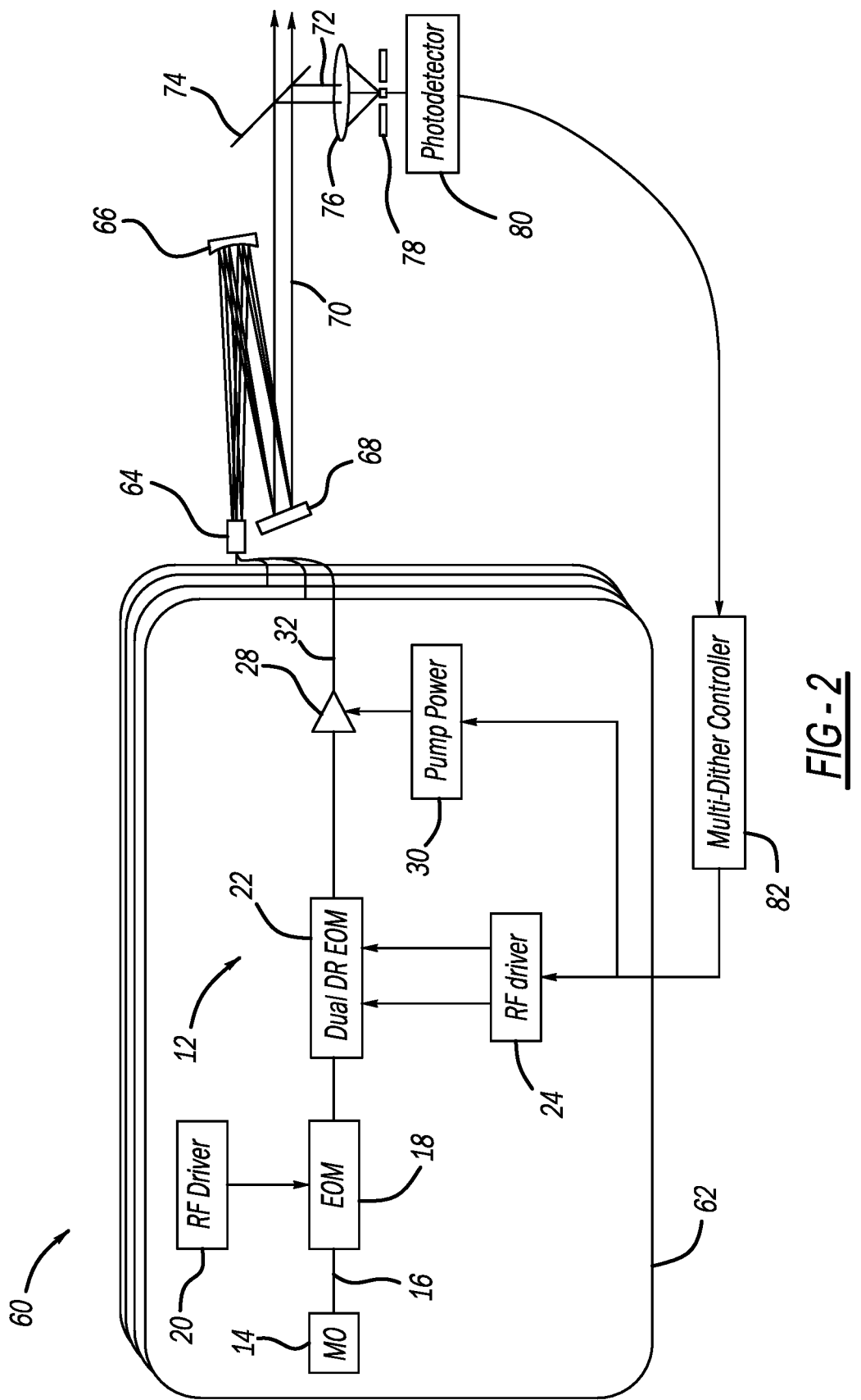
FIG. 2 is a schematic block diagram of an SBC fiber laser amplifier system including multiple wavelength channels and a servo control architecture in each channel.

The same architecture described above can be employed in an SBC fiber laser amplifier. FIG. 2 is a schematic block diagram of an SBC fiber laser amplifier system 60 that includes N number of wavelength channels 62 each having the same elements as the channel 12 and identified by the same reference number, where each channel 62 generates a different amplified beam whose spectrum is centered at one of the set of N wavelengths $\lambda_1, \ldots \lambda_N$. All of the amplified beams from the amplifiers 28 are directed to an optical emitter array 64 that outputs a set of diverging amplified beams into free space, where the individual beams with center wavelengths $\lambda_1, \ldots, \lambda_N$ are propagating from slightly different emitter positions. The diverging beams are reflected off of collimating optics 66 that collimates the diverging beams and directs them onto an SBC grating 68 so that all of the individual beams impact the grating 68 and overlap on the same footprint. The grating 68 spatially diffracts the set of individual beams centered at wavelengths $\lambda_1, \ldots, \lambda_N$ and directs the individual amplified beams in the same direction as a combined SBC output beam 70.

Because there are multiple beam wavelengths in the combined output beam 70, an FBG that would be tuned to a single wavelength cannot be used as the filter for removing the carrier spectrum for multiple beams. Also, because of the angular dispersion of the SBC grating 68, residual power in the spectral sidebands will manifest as spatial far field sidelobes away from the central lobe of the carrier spectrum, where the far field sidelobes correspond to the power in the spectral sidebands of the individual amplified beams. A low power sample beam 72 is sampled off of the combined SBC beam 70 by a beamsplitter 74 and is focussed by a lens 76 into the far field. A spatial filter 78 is used to block power in the central far field lobe and pass power in the sidelobes, where the filter 78 is positioned at the focal plane of the lens 76. The spatial filter 78 can be, for example, a transmissive photomask placed at the far field plane, i.e., the focal plane of the lens 76, where the opaque area of the photomask blocks light overlapped with the far field central lobe and corresponding to the spectral carrier band, and the transmissive areas transmit light away from the central lobe. The portion of the sample beam that passes through the spatial filter 78 is received by a photodetector 80 that converts the optical power to an electrical signal. The electrical signal from the photodetector 80 is sent to a multidither controller 82 that employs, for example, a stochastic parallel gradient descent (SPGD), or a similar algorithm, that is used to simultaneously dither any one of the parameters AM, FM or B-integral in the same manner as discussed above in each of the fiber amplifier channels 62 so as to also change the detected aggregate sidelobe power from all of the channels 62. The multidither controller 82 applies zero-correlation or orthogonal dithers to the multiple channels 62 so as to extract multiple error signals from the single photodetector signal. The multidither controller 82 can thus simultaneously minimize the wasted sideband power for the entire set of fiber amplifier channels 62.

Figure 3:
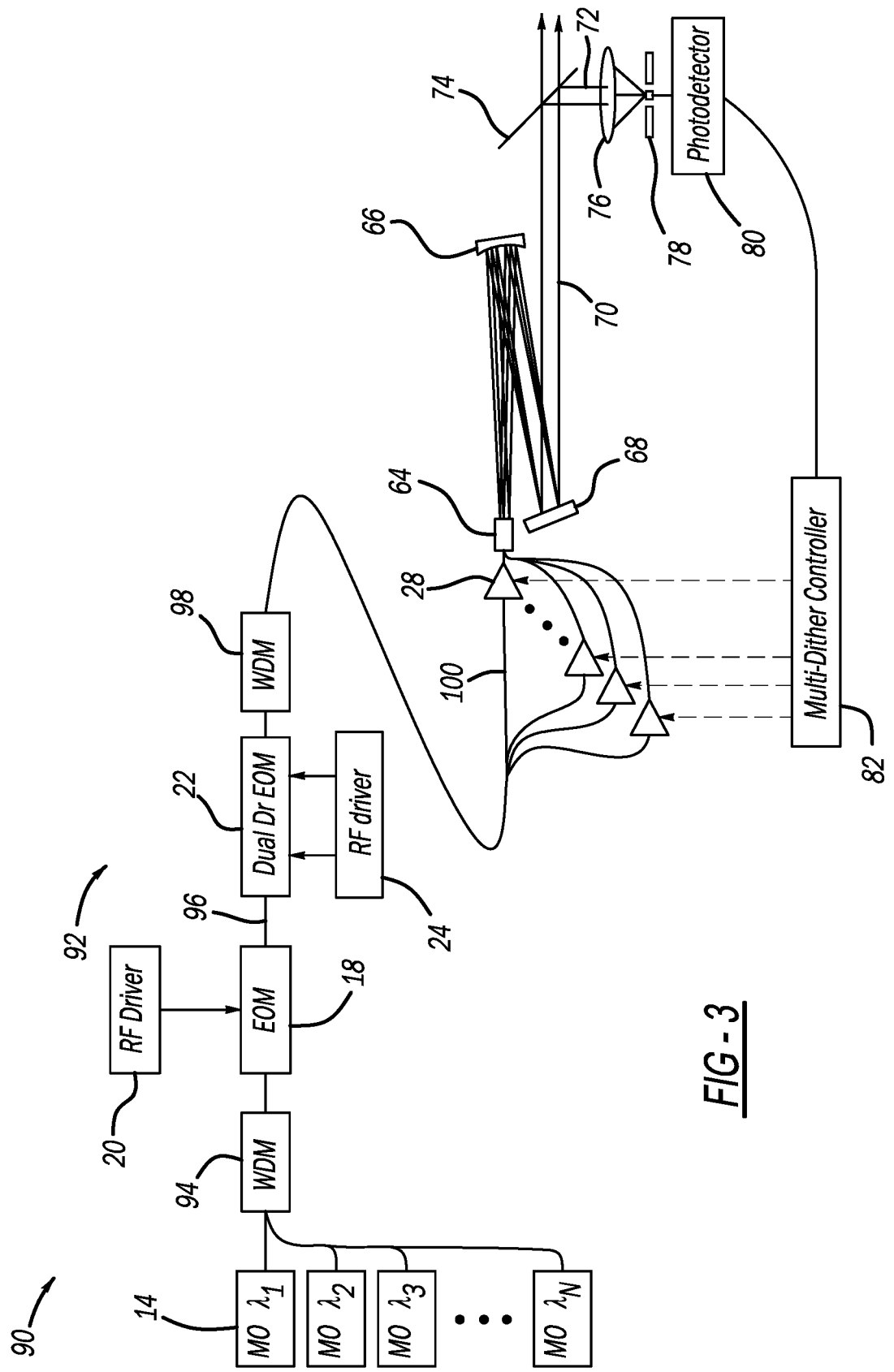
FIG. 3 is a schematic block diagram of an SBC fiber laser amplifier system including a single WDM seed beam source for multiple wavelength channels and a servo control architecture in each channel.

In an effort to minimize part count, weight, size and cost, spectral wavelength division multiplexing (WDM) can be employed in the seed beam source of an SBC fiber laser amplifier, such as described in US Patent Application Publication No. 2020/0227883 by Goodno et al., published Jul. 16, 2020, titled, Combined Laser Architecture Using Wavelength Multiplexed Seed Source, assigned to the assignee of this application and herein incorporated by reference. FIG. 3 is a schematic block diagram of a fiber laser amplifier system 90 showing this design, where like elements to the system 60 are idenitified by the same reference number. The N wavelengths $\lambda_1, \ldots, \lambda_N$ seed beams from all of the MOs 14 are combined in a single modulation channel 92. Particularly, the seed beams from all of the MOs 14 are sent to a spectral wavelength division multiplexer (WDM) 94 that multiplexes all of the wavelengths $\lambda_1, \ldots, \lambda_N$ of the seed beams onto a single fiber 96, where the combined seed beams are then sent to the EOM 18 and then to the EOM 22 to be modulated in the manner discussed above. The combined seed beam from the EOM 22 is then sent to a spectral WDM 98 that separates the different wavelength $\lambda_1, \ldots, \lambda_N$ seed beams into separate fibers 100 before being sent to the fiber amplifiers 28.

The spectral WDM 94 and the spectral WDM 98 can be any suitable wavelength division device for the purposes discussed herein. One technique is to simply use fiber splitters and bandpass filters, which are cheap and commercially available. However, fiber splitters are very lossy since only 1/N of the input power will be successfully transmitted into the output channels. An alternate approach with lower loss could be to use a wavelength-dependent element. For example, this could comprise a series of add-drop filters based on fiber Bragg gratings, or an arrayed waveguide grating (AWG), or a programmable spectral filter with multiple switchable output fibers. These are common solutions in the telecom wavelength band (~1550 nm). Since the spectral filter is programmable, it provides great flexibility in channel tuning and configuration. It can be configured to reject amplified stimulated emission arbitrarily close to each signal passband. It also provides the capability to spectrally shape all the channels using a single component, which could add utility for pre-compensation of FM to AM conversion. The channel seed beam wavelengths are spaced by at least the modulated linewidth to enable WDM re-distribution. For example, a set of ten channels at 4-nm spacings could be WDM'd within the 40-nm YDFA gain bandwidth, thus reducing modulator and RF driver parts counts and SWAP by a factor of 10×. The remainder of the system 90 functions as discussed above, but with the restriction that only the fiber amplifier pump powers, i.e., the B-integral, can be dithered and controlled and not the AM or FM parameters since all of the seed beams having the different wavelengths are modulated by a single EOM.

The WDM architecture employed in the system 90 limits channel wavelength spacing of the linewidth spanned by the AM/FM seed beams. This is many times broader than the compressed linewidths of the amplified beams following spectral compression, i.e., the spectral width of the carrier bands, and therefore would be limiting for a dense SBC system since the amplifier gain bandwidth can only be sparsely filled. In other words, as the number of N channels increases to enable higher SBC system powers, the wavelengths of the beams must be spaced closer together to fit within the amplifier gain bandwidth. However, the closer the wavelength channel spacing, the more difficult it is to separate seed beams with low crosstalk. It may be beneficial to modularize the WDM seed beam source into N/M groups of M channels each to seed a set of N high power channels. Also, modularizing the WDM seed beam source decouples the seed source component powers from the ultimate channel count for the N channel system. The module size M can be selected independently of the system channel count N. This flexibility enables use of lower power components in the WDM seed beam source.

Figure 4:
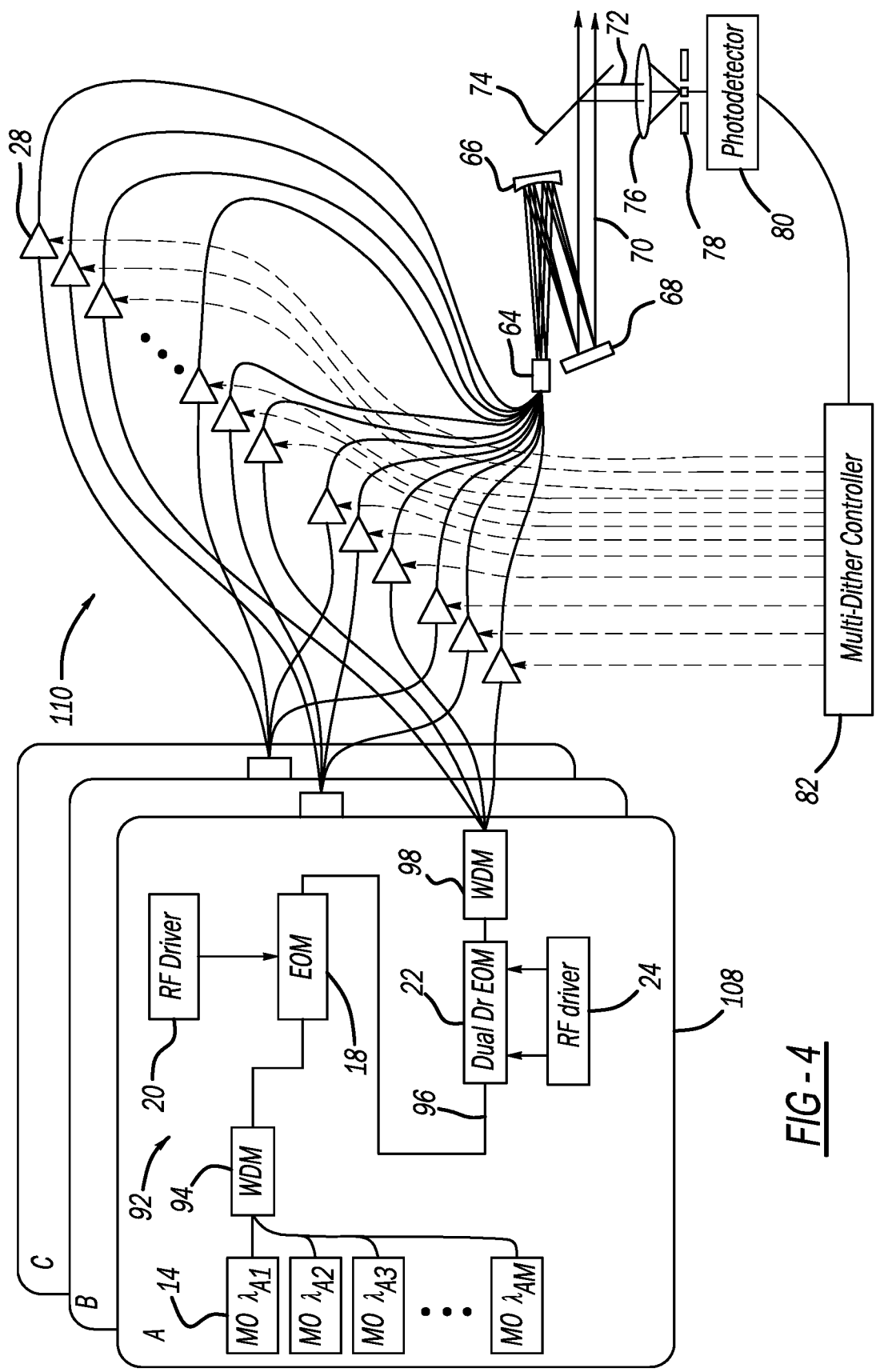
FIG. 4 is a schematic diagram of an SBC fiber laser amplifier system including multiple modularized WDM seed beam sources and a servo control architecture in each channel.
Figure 5:
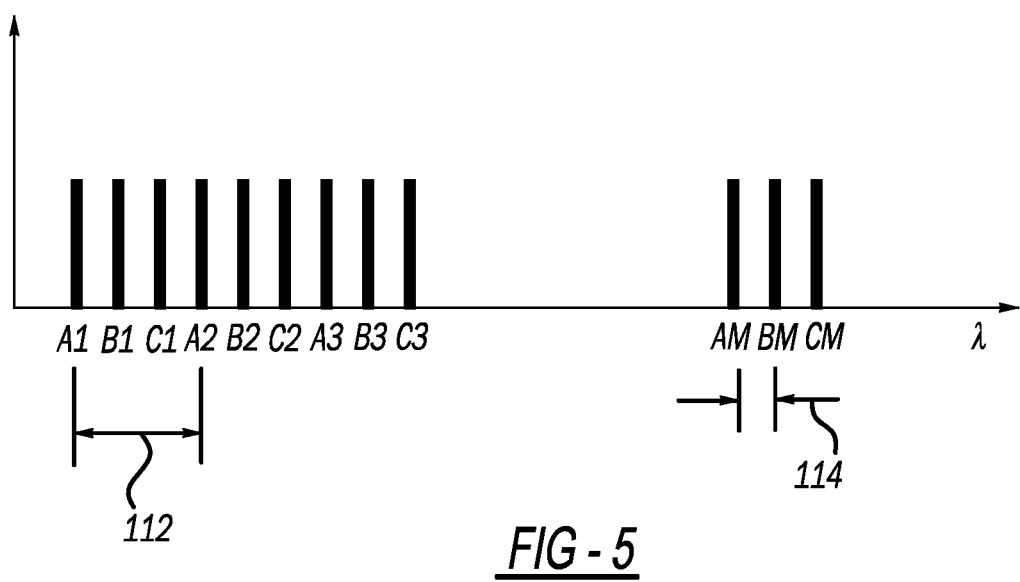
FIG. 5 is a wavelength plan for the amplifier system shown in FIG. 4.

FIG. 4 is a schematic block diagram of a fiber laser amplifier system 110 showing this design, where like elements to the system 90 are idenitified with the same reference number. The system 110 includes multiple modules 108, here three, each including the same group of MOs 14 operating at the same wavelengths as in the channels 92, described below as WDM groups A, B and C, that combine in an interleaved WDM architecture that enables dense wavelength spacing using nonlinear phase demodulation (NPD). One wavelength plan for the system 110 is shown in FIG. 5 over the gain bandwidth of the amplifier 28, where distance 112 is the wavelength spacing between channels in the WDM groups A, B and C and distance 114 is the interleaved channel spacing between the WDM groups A, B and C. Each group contains a subset of M channels, whose wavelengths are widely spaced to accommodate WDM, and whose total wavelength span is across the amplifier gain bandwidth. The wavelengths between groups are narrowly offset, with the offset being driven by the final spectral fill factor for the overall SBC fiber laser system using the compressed amplifier linewidths. The outputs of the WDM groups are amplified by the amplifiers 28 and interleaved according to their wavelengths to be sent to the emitter array 64. For example, the intra-group wavelength spacing might be 4 nm, and the number of channels within a WDM group might be M=10, thus spanning the 40-nm YDFA gain bandwidth. The wavelength offset between groups, which is identical to the final SBC channel spacing, such as 0.1 nm, would enable N/M 40 groups, for a total channel count of N=400 channels. At 2.5 kW/channel, this would enable a 1 MW SBC HEL. Thus, the architecture of the system 110 enables WDM to reduce SWAP-C of the front end without limiting the number of channels that can be combined in an SBC fiber laser amplifier system.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A fiber laser amplifier system comprising:
   at least one master oscillator providing an optical seed beam at a certain center wavelength;
   at least one phase modulation electro-optic modulator (EOM) responsive to the seed beam and a first RF drive signal, said phase modulation EOM phase modulating the seed beam using the first RF drive signal so as to broaden its spectral linewidth to span a carrier spectral band;
   at least one frequency modulation (FM) EOM responsive to the phase modulated seed beam and a second RF drive signal, said FM EOM frequency modulating the seed beam using the second drive signal so as to broaden its spectral linewidth beyond the carrier spectral band;
   at least one amplitude modulation (AM) EOM responsive to the phase modulated seed beam and a third RF drive signal, said AM EOM amplitude modulating the seed beam using the third drive signal so as to provide an amplitude modulated seed beam that is synchronized with the frequency modulated seed beam;
   at least one non-linear fiber amplifier receiving the AM and FM modulated seed beam and a pump power beam, said amplifier amplifying the seed beam using the pump power beam to provide an output beam where most of the beam power resides in the carrier spectral band;
   a beam sampler sampling off a sample beam from the output beam;

a filter receiving the sample beam and filtering out the carrier spectral band from the sample beam;
a photodetector for detecting beam power of the filtered sample beam and providing a beam power signal; and
a controller receiving the beam power signal, said controller controlling one or more of the second drive signal, the third drive signal and the pump power beam to change the FM modulation depth, AM modulation depth and/or pump power in a manner that reduces the beam power of the filtered sample beam.

2. The system according to claim 1 wherein the FM EOM and the AM EOM are separate modulation devices.

3. The system according to claim 1 wherein the FM EOM and the AM EOM are a single combined modulation device.

4. The system according to claim 1 wherein the filter is a fiber Bragg grating.

5. The system according to claim 1 wherein the controller is a hill climbing dither controller.

6. The system according to claim 1 wherein the fiber laser amplifier system includes a plurality of channels each including a master oscillator, a phase modulation EOM, an FM EOM, an AM EOM and a fiber amplifier where the master oscillator in each channel generates a seed beam at a different center wavelength, said system further comprising an emitter array responsive to all of the amplified beams that directs the amplified beams into free space as diverging uncombined beams, beam collimating optics responsive to the diverging uncombined beams that focuses the diverging uncombined beams as collimated uncombined beams, and an SBC grating responsive to the collimated uncombined beams that spatially combines the collimated uncombined beams so that all of the amplified beams at the different wavelengths are directed in the same direction as the output beam.

7. The system according to claim 6 wherein the controller is a multidither controller employing a stochastic parallel gradient descent algorithm.

8. The system according to claim 6 wherein the filter is a far-field photomask.

9. The system according to claim 1 wherein the at least one optical master oscillator is a plurality of master oscillators each generating a seed beam at a different center wavelength on a separate input fiber and the at least one non-linear fiber amplifier is a plurality of fiber amplifiers, said system further comprising a spectral multiplexer that receives all of the seed beams on the separate input fibers and spectrally combines the seed beams onto a common fiber where the combined seed beams are sent to the phase modulation EOM, the FM EOM and the AM EOM, a spectral demultiplexer responsive to the modulated and combined seed beams on the common fiber and spectrally separating the seed beams onto separate output fibers where each separated seed beam is sent to one of the amplifiers, an emitter array responsive to all of the amplified beams that directs the amplified beams into free space as diverging uncombined beams, beam collimating optics responsive to the diverging uncombined beams that focuses the diverging uncombined beams as collimated uncombined beams, and a spectral beam combining (SBC) grating responsive to the collimated uncombined beams that spatially combines the collimated uncombined beams so that all of the amplified beams at the different wavelengths are directed in the same direction as the output beam.

10. The system according to claim 9 wherein the plurality of master oscillators, the spectral multiplexer, the phase modulation EOM, the AM EOM, the FM EOM and the spectral demultiplexer are configured as a first seed beam source module in the fiber amplifier system, said fiber amplifier system including a plurality of seed beam modules each having a plurality of master oscillators operating at the same group of wavelengths, a spectral multiplexer, an AM EOM, an FM EOM and a spectral demultiplexer, wherein the output fibers from all of the modules are connected to the fiber amplifiers in an interleaved configuration.

11. A fiber laser amplifier system comprising:
a plurality of amplification channels each including a master oscillator providing an optical seed beam at different center wavelengths, a phase modulation electro-optic modulator (EOM) responsive to the seed beam and a first RF drive signal, said phase modulation EOM phase modulating the seed beam using the first RF drive signal so as to broaden its spectral linewidth to span a carrier spectral band, a frequency modulation (FM) EOM responsive to the phase modulated seed beam and a second RF drive signal, said FM EOM frequency modulating the seed beam using the second drive signal so as to broaden its spectral linewidth beyond the carrier spectral band, an amplitude modulation (AM) EOM responsive to the seed beam and a third RF drive signal, said AM EOM amplitude modulating the seed beam using the third drive signal so as to provide an amplitude modulated seed beam that is synchronized with the frequency modulated seed beam, and a non-linear fiber amplifier receiving the AM and FM modulated seed beam and a pump power beam, said amplifier amplifying the seed beam using the pump beam to provide an amplified beam having a carrier spectral band where most of the beam power resides;
an emitter array responsive to all of the amplified beams that directs the amplified beams into free space as diverging uncombined beams;
beam collimating optics responsive to the diverging uncombined beams that focuses the diverging uncombined beams as collimated uncombined beams;
a spectral beam combining (SBC) grating responsive to the collimated uncombined beams that spatially combines the collimated uncombined beams so that all of the amplified beams at the different wavelengths are directed in the same direction as an output beam;
a beam sampler sampling off a sample beam from the output beam;
a filter receiving the sample beam and filtering out the carrier spectral band of each amplified beam from the sample beam;
a photodetector for detecting beam power of the filtered sample beam and providing a beam power signal; and
a controller receiving the beam power signal, said controller controlling one or more of the second drive signal, the third drive signal and the pump power beam in each of the channels to change the FM modulation depth, AM modulation depth and/or pump power in a manner that reduces the beam power of the filtered sample beam.

12. The system according to claim 11 wherein the filter is a far-field photomask.

13. The system according to claim 11 wherein the controller is a multidither controller employing a stochastic parallel gradient descent algorithm.

14. The system according to claim 11 wherein the FM EOM and the AM EOM are separate modulation devices.

15. The system according to claim 11 wherein the FM EOM and the AM EOM are a single combined modulation device.

16. A spectral beam combining (SBC) fiber laser amplifier system comprising:
- a wavelength division multiplexing (WDM) seed beam source including a plurality of master oscillators each generating a seed beam at a different wavelength on a separate input fiber, a spectral multiplexer that receives all of the seed beams on the separate fibers and spectrally combines the seed beams onto a common fiber, a phase modulation electro-optic modulator (EOM) responsive to the seed beam and a first RF drive signal, said phase modulation EOM phase modulating the seed beam using the first RF drive signal so as to broaden its spectral linewidth to span a carrier spectral band, a frequency modulation (FM) EOM responsive to the seed beam and a second RF drive signal, said FM EOM frequency modulating the seed beam using the second drive signal so as to broaden its spectral linewidth beyond the carrier spectral band, an amplitude modulation (AM) EOM responsive to the seed beam and a third RF drive signal, said AM EOM amplitude modulating the seed beam using the third drive signal so as to provide an amplitude modulated seed beam that is synchronized with the frequency modulated seed beam, and a spectral demultiplexer responsive to the modulated and combined seed beams on the common fiber and spectrally separating the seed beams onto separate output fibers;
- a plurality of fiber amplifiers each amplifying the modulated seed beam on one of the output fibers;
- an emitter array responsive to all of the amplified beams that directs the amplified beams into free space as diverging uncombined beams;
- beam collimating optics responsive to the diverging uncombined beams that focuses the diverging uncombined beams as collimated uncombined beams;
- an SBC grating responsive to the collimated uncombined beams that spatially combines the collimated uncombined beams so that all of the amplified beams at the different wavelengths are directed in the same direction as an output beam;
- a beam sampler sampling off a sample beam from the output beam;
- a filter receiving the sample beam and filtering out the carrier spectral band of each amplified beam from the sample beam;
- a photodetector for detecting beam power of the filtered sample beam and providing a beam power signal; and
- a controller receiving the beam power signal, said controller controlling the pump power beam to change the pump power in a manner that reduces the beam power of the filtered sample beam.

17. The system according to claim 16 wherein the plurality of master oscillators, the spectral multiplexer, the AM EOM, the FM EOM and the spectral demultiplexer are configured as a first seed beam source module in the fiber amplifier system, said fiber amplifier system including a plurality of seed beam modules each having a plurality of master oscillators operating at the same group of wavelengths, a spectral multiplexer, an AM EOM, an FM EOM and a spectral demultiplexer, wherein the output fibers from all of the modules are connected to the fiber amplifiers in an interleaved configuration.

18. The system according to claim 16 wherein the filter is a far-field photomask.

19. The system according to claim 16 wherein the controller is a multidither controller employing a stochastic parallel gradient descent algorithm.

* * * * *